United States Patent [19]
Fields et al.

[11] Patent Number: 6,160,504
[45] Date of Patent: Dec. 12, 2000

[54] REPETITIVE ABSORPTIVE THRESHOLDING OPTICAL QUANTIZER

[75] Inventors: Richard A. Fields, Redondo Beach; Juan C. Carillo, Jr., Torrance; Mark Kintis; Elizabeth T. Kunkee, both of Manhattan Beach; Lawrence J. Lembo, Torrance; Stephen R. Perkins, Redondo Beach; David L. Rollins, Hawthorne; Eric L. Upton; Bruce A. Ferguson, both of Redondo Beach, all of Calif.

[73] Assignee: TRW Inc., Redondo Beach, Calif.

[21] Appl. No.: 09/343,733

[22] Filed: Jun. 30, 1999

[51] Int. Cl.⁷ ...................................................... H03M 1/00
[52] U.S. Cl. ........................... 341/137; 341/126; 341/155
[58] Field of Search ..................................... 341/137, 126, 341/155

[56] References Cited

U.S. PATENT DOCUMENTS

| | | |
|---|---|---|
| 4,441,096 | 4/1984 | Evanchuk ................................. 340/347 |
| 4,723,248 | 2/1988 | Harter et al. . |
| 4,851,840 | 7/1989 | McAulay ................................. 341/137 |
| 4,928,007 | 5/1990 | Furstenau et al. ....................... 341/137 |
| 4,934,782 | 6/1990 | Soffer et al. . |
| 4,947,170 | 8/1990 | Falk ......................................... 341/137 |
| 4,962,502 | 10/1990 | Adams . |
| 4,973,125 | 11/1990 | Normandin . |
| 5,010,346 | 4/1991 | Hamilton et al. ........................ 341/137 |
| 5,146,517 | 9/1992 | Avramopoulos et al. . |
| 5,337,180 | 8/1994 | Woods et al. . |
| 6,064,325 | 5/2000 | Fields et al. ............................. 341/137 |

*Primary Examiner*—Brian Young
*Assistant Examiner*—Jason L W Kost
*Attorney, Agent, or Firm*—Michael S. Yatsko

[57] ABSTRACT

An optical quantizer (10) that employs a chain of optical thresholding devices (16) positioned in the propagation path of an optical input beam (12) to be quantized. Each optical thresholding device (16) saturates and turns transparent if the intensity of the optical beam (12) that impinges it is above a predetermined threshold level designed into the device (16). If the input beam (12) saturates the optical thresholding device (16), the device (16) outputs an indicator signal (22) identifying the saturation. The input beam (12) propagates through the optical thresholding device (16) with some attenuation caused by the saturation, and impinges subsequent optical thresholding devices (16) in the chain. Eventually, the attenuation of the input beam (12) caused by the multiple saturations will decrease the beam intensity below the threshold level of the next optical thresholding device (16). The number of indicator signals (22) gives an indication of the intensity of the input beam (12). The optical thresholding devices (16) can provide optical or electrical indicator signals (22) depending on the type of thresholding device (16) used.

32 Claims, 1 Drawing Sheet

REPETITIVE ABSORPTIVE THRESHOLDING OPTICAL QUANTIZER

BACKGROUND OF THE INVENTION

1. Field of the Invention

This invention relates generally to an optical quantizer and, more particularly, to an optical quantizer that employs a chain of optical thresholding devices positioned in a propagation path of an optical input beam that provide a series of indicator signals indicative of the intensity of the input beam.

2. Discussion of the Related Art

Advances in signal processing technology, including the need for greater processing speeds increased channel bandwidths and improved transmission reliability, has resulted in a steadily growing focus on the optical domain and the vast potential that lies therein with respect to these parameters. However, optical technology, as compared to electrical and radio frequency based technology, lacks the necessary technical sophistication in many areas. Particularly, the desire for high-speed, large-bandwidth processing devices employing digital optics has been hampered by the lack of many basic optical devices and technologies readily available in the RF domain.

Optical analog-to-digital (A/D) converters are one such device that has not heretofore met basic design requirements. Current digital optical systems rely on digital conversion in the electrical/RF domain. This requires conversion back and forth between the optical and RF domains that are slower, have more loss and are noisier than conversions in the optical domain only. An optical device that converts an optical analog signal to an optical digital signal with little or no reliance on RF technology would reduce system complexity and provide for high speed and large bandwidth processing advances. Optical quantizers that take an analog-optical input signal and generate a coded, quantized output that corresponds to the intensity of the input signal is a necessary and important part of optical A/D converters.

U.S. patent application Ser. No. 09/133,138, filed Aug. 11, 1998, titled "Upper-Folding Successive-Approximation Optical Analog-To-Digital Converter and Method of Performing Conversion," and assigned to the assignee of this application, is directed to an optical A/D converter that provides an analog-to-digital conversion within the optical domain without the need to subtract optical signals. Further, U.S. patent application Ser. No. 09/345,295, filed herewith titled "Delayed Pulse Saturable Absorber-Based Downward-Folding Optical A/D," also assigned to the assignee of this application, is directed to an optical A/D converter that also provides an analog-to-digital conversion within the optical domain that employs the use of optical thresholding devices and saturable absorbers.

What is needed is an efficient, cost effective and reliable optical quantizer that has application to be used in an optical A/D converter. It is therefore an object of the present invention to provide such an optical quantizer.

SUMMARY OF THE INVENTION

In accordance with the teachings of the present invention, an optical quantizer is disclosed that employs a chain of optical thresholding devices positioned in the propagation path of an optical input beam to be quantized. Each optical thresholding device saturates and turns transparent if the intensity of the optical beam that impinges it is above a predetermined threshold level designed into the device. If the input beam saturates the optical thresholding device, the device outputs an indicator signal identifying the saturation. The input beam then propagates through the optical thresholding device with some attenuation caused by the saturation, and impinges subsequent optical thresholding devices in the chain. Eventually, the attenuation of the input beam caused by the multiple saturations will decrease the beam intensity below the threshold level of the next optical thresholding device. The number of indicator signals gives an indication of the intensity of the input beam.

In one particular embodiment, the optical thresholding devices are saturable absorbers that receive an optical control beam. If the saturable absorber saturates and turns transparent, the control beam passes through the thresholding device as an optical indicator beam. Photodetectors can be provided to convert the optical indicator beam to an electrical representation if desired. In an alternate embodiment, the optical thresholding devices are semiconductor saturable absorbers that are configured in a reverse-biased p-i-n layout, where the input beam generates electron/hole charge carriers in the saturable absorbers that generates a current flow that can be measured as the indicator signal. When the semiconductor saturable absorber saturates, it turns transparent and the maximum number of charge carriers are generated.

Additional objects, advantages, and features of the present invention will become apparent from the following description and appended claims, taken in conjunction with the accompanying drawings.

DETAILED DESCRIPTION OF THE PREFERRED EMBODIMENTS

The following discussion of the preferred embodiments directed to a repetitive absorptive thresholding optical quantizer is merely exemplary in nature and is in no way intended to limit the invention or its applications or uses.

Figure 1:
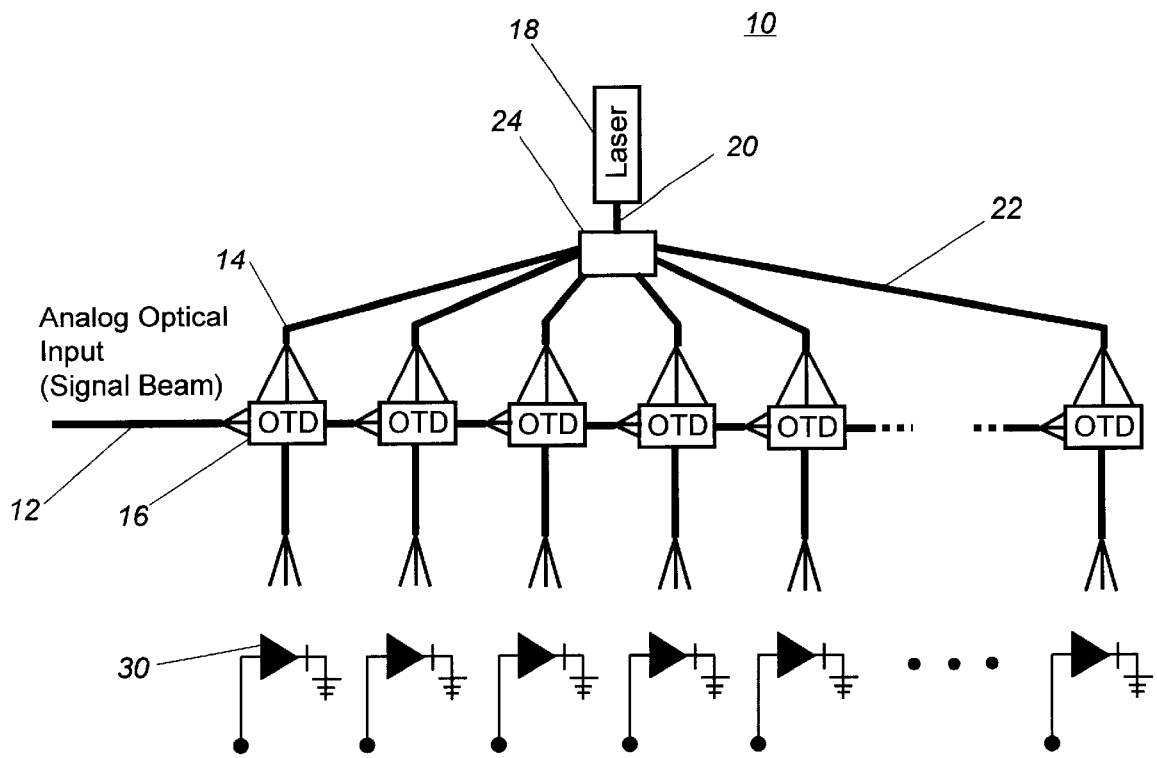
FIG. 1 is a schematic plan view of a repetitive absorptive optical thresholding quantizer, according to an embodiment of the present invention.

FIG. 1 is a schematic block diagram of a repetitive absorptive optical quantizer 10, according to an embodiment of the present invention. The quantizer 10 receives an analog optical input beam 12 having an intensity between a minimum value, such as zero, and some known maximum value, such as a normalized one, from a suitable optical source (not shown). In one embodiment, the input beam 12 is modulated with an analog RF signal. The modulation of the beam 12 can be by any suitable signal, both analog and digital. The output of the quantizer 10 is a plurality of indicator beams that give a representation of the intensity of the optical beam 12, where the intensity representation has a resolution that is directly related to the number of stages 14 in the quantizer 10, as will be discussed below. If there are M number of stages 14, the quantizer 10 can quantize input beam 12 intensities between zero and M times the threshold intensity of each stage. The quantizer 10 has a direct application to be used in an analog-to-digital A/D converter, as will be apparent to those skilled in the art. A sample and hold circuit (not shown) may be used in connection with the quantizer 10, as well as other processing circuitry, such as binary detection and conversion circuitry, to complete the A/D converter.

However, as would be appreciated by those skilled in the art, the quantizer 10 is not limited to an A/D converter, but has other applications for other devices that would require an optical intensity representation.

The quantizer 10 includes a plurality of stages 14, where each stage 14 includes a saturable absorber 16, acting as an optical thresholding device (OTD), that are positioned along the propagation path of the optical beam 12, so that the beam 12 is directed at each saturable absorber 16 in each stage 14. A saturable absorber is a known optical device that is generally opaque in a normal state, but when an optical beam having an intensity above a threshold level of the absorber impinges it, the absorber will saturate and become transparent. Saturable absorbers of this type that exhibit these properties have been well known in the art for their use in mode-lock lasers. A discussion of saturable absorbers can be found in U.S. Pat. No. 5,303,256.

The absorbers 16 measure the intensity of the beam 12, and if it exceeds the predetermined threshold level designed into the absorber 16, the beam 12 will pass onto the next stage 14. Therefore, if the optical beam 12 has a large enough intensity when it impinges the absorber 16 in one stage 14, it will continue on to impinge the absorber 16 in the next stage 14, and so forth, as shown. If the beam 12 does not have a large enough intensity to saturate a next absorber 16, then it is absorbed by the absorber 16 and does not pass through. Saturable absorbers are used by way of a non-limiting example, in that any optical thresholding device having the properties described herein can be used as would be appreciated by those skilled in the art. U.S. Pat. Nos. 5,337,180 and 4,934,782 disclose other types of optical thresholding devices that may be applicable.

The quantizer 10 further includes a control laser 18 that generates a laser beam 20. The laser beam 20 is split into a plurality of indicator beams 22 by a splitter 24, so that a separate split indicator beam 22 is directed towards the absorber 16 in each stage 14, as shown. The splitter 24 can be any optical splitter known in the art suitable for the purpose described herein. Alternately, a separate control laser generating a separate indicator beam can be provided for each stage 14. The indicator beam 22 impinges the absorber 16 from a direction relative to the propagation direction of the beam 12 so that the beam 22 does not couple with the beam 12, and obscure the signal strength of the beam 12. In this example, the indicator beam 22 and the input beam 12 are oriented at substantially 90° relative to each other at the absorbers 16. Also, for efficient operation, the wavelengths of the beam 12 and the laser beam 20 should be the same or nearly the same, although that is not required for all applications. The wavelengths of the input beam 12 and the indicator beams 22 may need to be nearly the same because a saturable absorber may only operate over a certain range of wavelengths.

If the intensity of the beam 12 is large enough to saturate the absorber 16 and make it transparent, the indicator beam 22 will pass through the absorber 16 unabsorbed. If, however, the input beam 12 does not saturate the absorber 16, then the indicator beam 22 is absorbed by the absorber 16 and does not pass through. The intensity of the indicator beam 22 is not large enough to saturate the absorber 16 by itself, and in one embodiment, the intensity of the indicator beam 22 is much less than the intensity of the input beam 12 when it is greater than zero. So, for practical purposes, the intensity of the indicator beam 22 is negligible with respect to saturating the absorber 16.

If the intensity of the beam 12 is large enough to saturate an absorber 16, a small amount of light in the beam 12 is still absorbed by the absorber 16 by the saturation process. Therefore, the intensity of the beam 12 will continue to be attenuated and decrease in intensity each time it passes through an absorber 16. Assuming that the intensity of the beam 12 is not greater than the maximum resolution of the quantizer 10, the beam 12 will eventually be absorbed by one of the absorbers 16. The number of indicator beams 22 that pass through the absorbers 16 in the previous stages 14 gives an intensity representation of the input beam 12. The greater the intensity of the input beam 12, the more indicator beams 22 pass through. The output of the quantizer 10 is a set of indicator beams 22 that are activated in a "thermometer code" manner. The output of the quantizer 10 is the indicator beams 22, not the input beam 12.

By carefully designing the threshold level for each absorber 16 and providing several stages 14, for example sixteen, an accurate representation of the intensity of the beam 12 can be obtained. In one embodiment, the number of stages 14 would be a power of two so that the "thermometer code" output of the quantizer 10 can be readily converted to a binary word output for the A/D application. The design choice of the threshold levels for the absorbers 16 will effect the performance and usefulness of the quantizer 10. If each of the absorbers 16 is designed to have the same threshold level and provide the same attenuation of the beam 12, then the quantizer 10 will provide a linear intensity-to-quantization mapping. In other words, an input beam with an intensity 2I will activate twice as many indicator beams 22 as an input beam with an intensity I. For other applications, linear mapping may not be desirable, and thus the absorbers 16 can be custom designed for non-linear or non-uniform mapping in accordance with the particular application.

The indicator beams 22 that pass through the absorbers 16 can be directed to other optical devices (not shown) for optical processing in accordance with the particular application, such as analog-to-digital conversion, that is used in connection with the quantizer 10. Alternately, the indicator beams 22 can be directed to separate photodetectors 30 in each stage 14 to convert the indicator beams 22 to corresponding electrical signals for applications requiring electrical signals.

Figure 2:
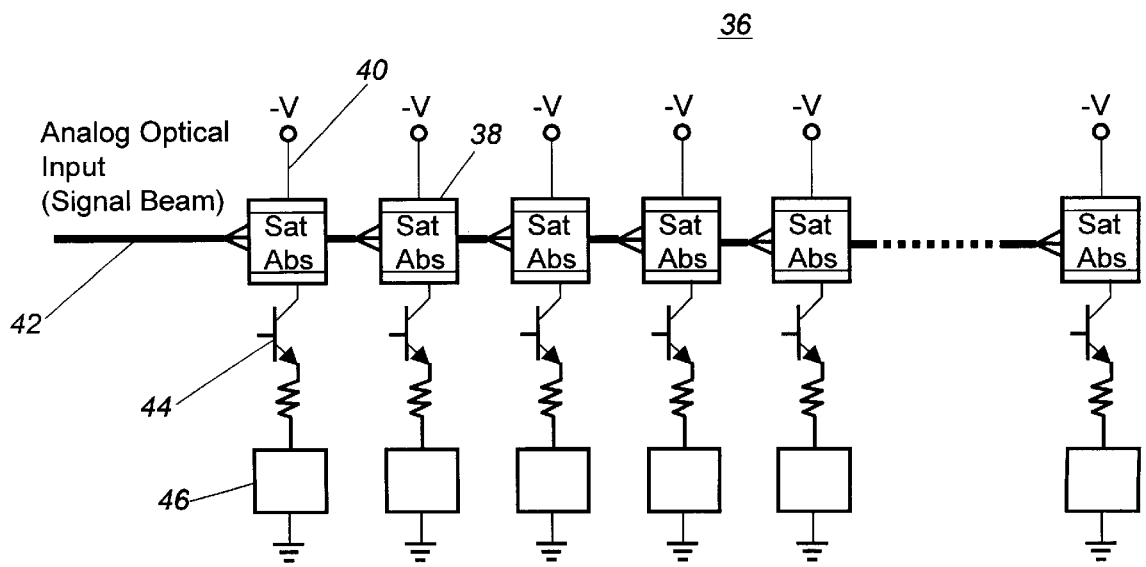
FIG. 2 is a schematic plan view of a repetitive absorptive optical quantizer, according to another embodiment of the present invention.

FIG. 2 is a schematic block diagram of a quantizer 36 that is an alternate embodiment of the quantizer 10. Instead of using the generic optical threshold devices 16, the quantizer 36 specifically uses semiconductor saturable absorbers 38 in each of a plurality of stages 40. Semiconductor saturable absorbers absorb light energy and create electron/hole charge pairs from the incident photons. The semiconductor saturable absorber 38 is configured as a reverse-biased p-i-n structure, so that the reverse bias will induce a photocurrent in the absorber 38 by this process of photo-absorption. A negative voltage potential is applied to the absorber 38 to provide the reverse bias. Once the absorber 38 generates all of the electron/hole pairs that it is capable of, it saturates and becomes transparent. When the absorber 38 saturates, it produces its maximum current flow in the reverse-bias case. Thus, the semiconductor saturable absorber can be used to produce an electrical signal proportional to the intensity of an impinging beam that it absorbs, allowing an indicator current to be produced.

As with the quantizer 10 discussed above, each of the absorbers 38 is positioned along the propagation path of an input beam 42 so that the beam 42 impinges the absorber 38 in each stage 40. If the intensity of the beam 42 is greater than the saturation threshold level of the absorber 38, the absorber 38 will turn transparent and pass the beam 42 with some attenuation of intensity. Eventually the attenuation will reduce the intensity of the beam 42 below the saturation threshold level of the absorber 38 in the next stage 40.

When the beam 42 impinges the absorber 38, electron/hole charge carriers are created and the reverse-bias applied to the absorber 38 causes the current generated by the carriers to flow to a transistor 44 connected to the n layer of the absorber 38. This creates a voltage potential on the emitter of the transistor 44 that is a measure of the current generated. A current or voltage thresholding circuit 46 is provided that measures the current from the saturable absorber 38. If the beam 42 does not impinge the absorber 38, no current is generated. The last absorber 38 in the chain that receives the beam 42, but does not saturate, will generate a current that is less than the current generated by a saturated absorber, so that it can be distinguished by the thresholding circuit 46. The transistor 44 and the thresholding circuit 46 can be replaced by any suitable current detecting device to provide a measure of the current flow in the absorber 38, as would be appreciated by those skilled in the art. Therefore, the measure of the current flow acts in the same manner as the indicator beams 22, discussed above, to give an indication of the intensity of the beam 42. In this embodiment, however, an optical indication is not provided. The threshold level of each of the absorbers 38 can be designed in the manner as discussed above to provide a desired indication of the intensity of the beam 42.

The quantizers 10 and 36 differ from most A/D converter designs in that they perform a quantization on the input signal without sampling. This "quantized-analog" operation can be combined with sampling to produce a conventional A/D converter. However, the quantizer of the invention also enables an optical-intensity-to-spatial conversion without sampling. Such a conversion can provide a spatial optical processing environment.

Sampling can be performed either before the absorber chain or on the various indicator outputs. If the sampling is performed before the chain, then the absorptive chain operates to produces N indicator outputs, with a number M of those outputs on, where the ratio of M to N is the quantized value of the ratio to the input intensity sample to the maximum acceptable intensity. If the sampling is performed after the indicator signals are produced, variable sampling rates amongst the various outputs can be enabled. This could allow a faster sampling of the LSB outputs relative to the MSB outputs.

For the quantizers discussed above, the specific frequencies of the modulating signal of the input beams are not important, except that there is a finite response time associated with the quantizer. There is also a finite processing time associated with the converter when sampling the signal, and the Nyquist condition must be satisfied for the optical A/D to adequately sample the signal.

The foregoing discussion discloses and describes merely exemplary embodiments of the present invention. One skilled in the art will readily recognize from such discussion, and from the accompanying drawings and claims, that various, changes, modifications and variations can be made therein without departing from the spirit and scope of the invention as defined in the following claims.

What is claimed is:

1. An optical device for quantizing an optical input beam, said device comprising a plurality of optical stages where each stage includes an optical thresholding device having a predetermined threshold level, each optical thresholding device being positioned along an optical path defined by the propagation direction of the optical input beam, wherein if the intensity of the optical input beam is large enough to exceed the threshold level of a thresholding device, the thresholding device generates an indicator signal and the optical beam passes through the thresholding device, said thresholding device attenuating the optical beam as it passes therethrough, and wherein the number of indicator signals from the thresholding device is an indication of the intensity of the optical input beam.

2. The device according to claim 1 wherein the optical thresholding devices are saturable absorbers, said optical beam saturating the saturable absorber and making it transparent if the intensity of the optical beam is greater than the threshold level of the absorber.

3. The device according to claim 2 wherein the saturable absorber provides an optical indicator beam if the optical input beam saturates the absorber.

4. The device according to claim 3 further comprising at least one optical source generating a control beam, each of the saturable absorber being responsive to the control beam and outputting the control beam as a separate indicator beam if the saturable absorber is saturated.

5. The device according to claim 4 wherein the at least one optical source is a single optical source, said device further comprising a beam splitter that splits the control beam into a plurality of control beams and directs a separate split control beam to each of the absorbers.

6. The device according to claim 4 wherein the control beams and the input beam impinge the absorbers such that they do not interfere with each other in the absorber.

7. The device according to claim 4 wherein the input beam and the control beam have substantially the same wavelength.

8. The device according to claim 3 wherein each stage further includes a separate photodetector that is responsive to the optical indicator beams, said photodetector generating an electrical signal indicative of the indicator beam.

9. The device according to claim 2 wherein the saturable absorbers are semiconductor saturable absorbers that generate charge carriers in response to the input beam, said semiconductor saturable absorber providing an electrical indicator signal in response to the optical beam.

10. The device according to claim 9 further comprising an electrical measuring device in each stage that receives the electrical indicator signal and provides a signal indicative of the number of charge carriers.

11. The device according to claim 10 wherein the electrical measuring device includes a transistor and a voltage detector.

12. The device according to claim 9 wherein each semiconductor saturable absorber is configured as a reverse biased p-i-n structure.

13. The device according to claim 1 wherein each thresholding device receives a control signal and outputs an optical indicator signal if the input beam exceeds the threshold level.

14. The device according to claim 1 wherein each thresholding device receives a voltage signal and outputs an electrical indicator signal if the input beam exceeds the threshold level.

15. The device according to claim 1 wherein the quantizer is part of an optical analog-to-digital converter.

16. The device according to claim 1 wherein the threshold level for each optical thresholding device is substantially the same.

17. The device according to claim 1 wherein the number of stages is a power of two.

18. An optical device for quantizing an optical input beam, said device comprising:

at least one optical source generating a control beam; and a plurality of optical stages where each stage includes an optical thresholding device having a predetermined threshold level, each of the thresholding devices receiving the control beam, said optical thresholding devices being positioned along an optical path defined by the propagation direction of the optical input beam, wherein if the intensity of the optical input beam is large enough to exceed the threshold level of a thresholding device, the thresholding device saturates and turns transparent so that the control beam passes through the thresholding device as an optical indicator beam and the optical input beam passes through the thresholding device, said thresholding device attenuating the optical beam as it passes therethrough, and wherein the number of optical indicator signals passing through the thresholding devices is an indication of the intensity of the input beam.

19. The device according to claim 18 wherein the optical thresholding devices are saturable absorbers.

20. The device according to claim 18 wherein the at least one optical source is a single optical source, said device further comprising a beam splitter that splits the control beam into a plurality of control beams and directs a separate split control beam to each of the absorbers.

21. The device according to claim 18 wherein the control beam and the input beam impinge the optical thresholding devices at an orientation relative to each other so that they do not interfere with each other in the thresholding devices.

22. The device according to claim 18 wherein the input beam and the control beam have substantially the same wavelength.

23. The device according to claim 18 where each stage further includes a separate photodetector that is responsive to the optical indicator signal, said photodetector generating an electrical signal indicative of the indicator signal.

24. An optical device for quantizing an optical input beam, said device comprising a plurality of optical stages where each stage includes a semiconductor saturable absorber and an electrical measuring system, each semiconductor saturable absorber having a predetermined threshold level and being positioned along an optical path defined by the propagation direction of the optical input beam, said saturable absorbers generating charge carriers in response to the input beam, wherein if the intensity of the optical input beam is large enough to exceed the threshold level of a semiconductor saturable absorber, the saturable absorber saturates and turns transparent allowing the optical input beam to pass through the absorber, said saturable absorber attenuating the optical beam as it passes therethrough, and wherein the electrical measuring systems provide an electrical measurement of the charge carriers generated by the semiconductor saturable absorbers, and the combination of electrical measurements is an indication of the intensity of the optical input beam.

25. The device according to claim 24 wherein each semiconductor saturable absorber is configured as a reversed bias p-i-n structure.

26. An optical device for quantizing an optical input beam, said device comprising a plurality of optical stages where each stage includes an optical thresholding device having a predetermined threshold level, each optical thresholding device being positioned along an optical path defined by the propagation direction of the optical input beam, wherein if the intensity of the optical input beam is large enough to exceed the threshold level of a thresholding device, the thresholding device generates an indicator signal where the number of indicator signals from the thresholding device is an indication of the intensity of the optical input beam.

27. The device according to claim 26 wherein the device is part of an optical analog-to-digital converter.

28. A method of quantizing an optical input beam, said method comprising the steps of:

positioning a plurality of optical thresholding devices along an optical path defined by the propagation direction of the optical input beam, each of the optical thresholding devices having a predetermined threshold level;

saturating each optical thresholding device that the input beam impinges if the intensity of the input beam is above the threshold level of the thresholding device, wherein if the intensity of the input beam is above the threshold level of the thresholding device, the thresholding device saturates and turns transparent allowing the input beam to pass therethrough with some attenuation; and providing an indicator signal for each thresholding device that has been saturated by the input beam.

29. The method according to claim 28 wherein the step of positioning a plurality of thresholding devices includes positioning a plurality of saturable absorbers.

30. The method according to claim 29 wherein the step of positioning a plurality of saturable absorbers includes positioning a plurality of semiconductor saturable absorbers configured as reversed biased p-i-n structures.

31. The method according to claim 30 wherein the step of providing indicator signals includes providing electrical indicator signals of the charge carriers generated by the semiconductor saturable absorbers.

32. The method according to claim 29 wherein the step of generating indicator signals includes generating optical indicator beams if the optical input beam saturates the absorber.

* * * * *